United States Patent [19]

Nagafuchi et al.

[11] Patent Number: 5,162,071
[45] Date of Patent: Nov. 10, 1992

[54] ADJUSTABLE FILM CUTOFF UNIT

[75] Inventors: Yasuhiro Nagafuchi, Chiba; Mitsuhiro Seki, Tokyo; Shigeo Sumi, Saitama; Fumio Hamamura, Kanagawa, all of Japan

[73] Assignee: Somar Corporation, Tokyo, Japan

[21] Appl. No.: 532,417

[22] Filed: Jun. 4, 1990

[30] Foreign Application Priority Data

Jun. 4, 1989 [JP] Japan .................. 1-141966

[51] Int. Cl.$^5$ .............................................. B32B 31/18
[52] U.S. Cl. .................... 156/517; 156/521; 156/522; 156/552
[58] Field of Search ................ 156/517, 521, 522, 552

[56] References Cited

U.S. PATENT DOCUMENTS

| | | | |
|---|---|---|---|
| 3,750,510 | 8/1973 | Gabriels | 83/305 |
| 4,323,416 | 4/1982 | Malthouse et al. | 156/521 |
| 4,585,509 | 4/1986 | Obayashi | 156/497 |
| 4,964,937 | 10/1990 | Seki | 156/521 |
| 4,986,873 | 1/1991 | Hamamura | 156/552 |

FOREIGN PATENT DOCUMENTS

| | | |
|---|---|---|
| 0125584 | 11/1984 | European Pat. Off. . |
| 0283741 | 9/1988 | European Pat. Off. . |
| 0320965 | 6/1989 | European Pat. Off. . |
| 2190029 | 11/1987 | United Kingdom . |

Primary Examiner—Caleb Weston
Attorney, Agent, or Firm—Sughrue, Mion, Zinn, Macpeak & Seas

[57] ABSTRACT

A thin film laminating apparatus which is operative to bond a continuous thin film to the surface of a base plate, using heat and pressure applied by a pressure laminating roller, and to cut the film to a length corresponding to that of the base plate. The apparatus has an adjustable film cut-off unit having a fixed cutter and a rotary cutter, both of which extend across the width of the thin film, transverse to the direction of continuous film feed. The fixed cutter and the rotary cutter are independently supported by members which are movable and convey the respective cutters into and out of a film cutting position. The support members are movable manually, to permit initial insertion of the thin film into a cutoff position, and automatically during continuous operation of the thin film laminating apparatus.

7 Claims, 7 Drawing Sheets

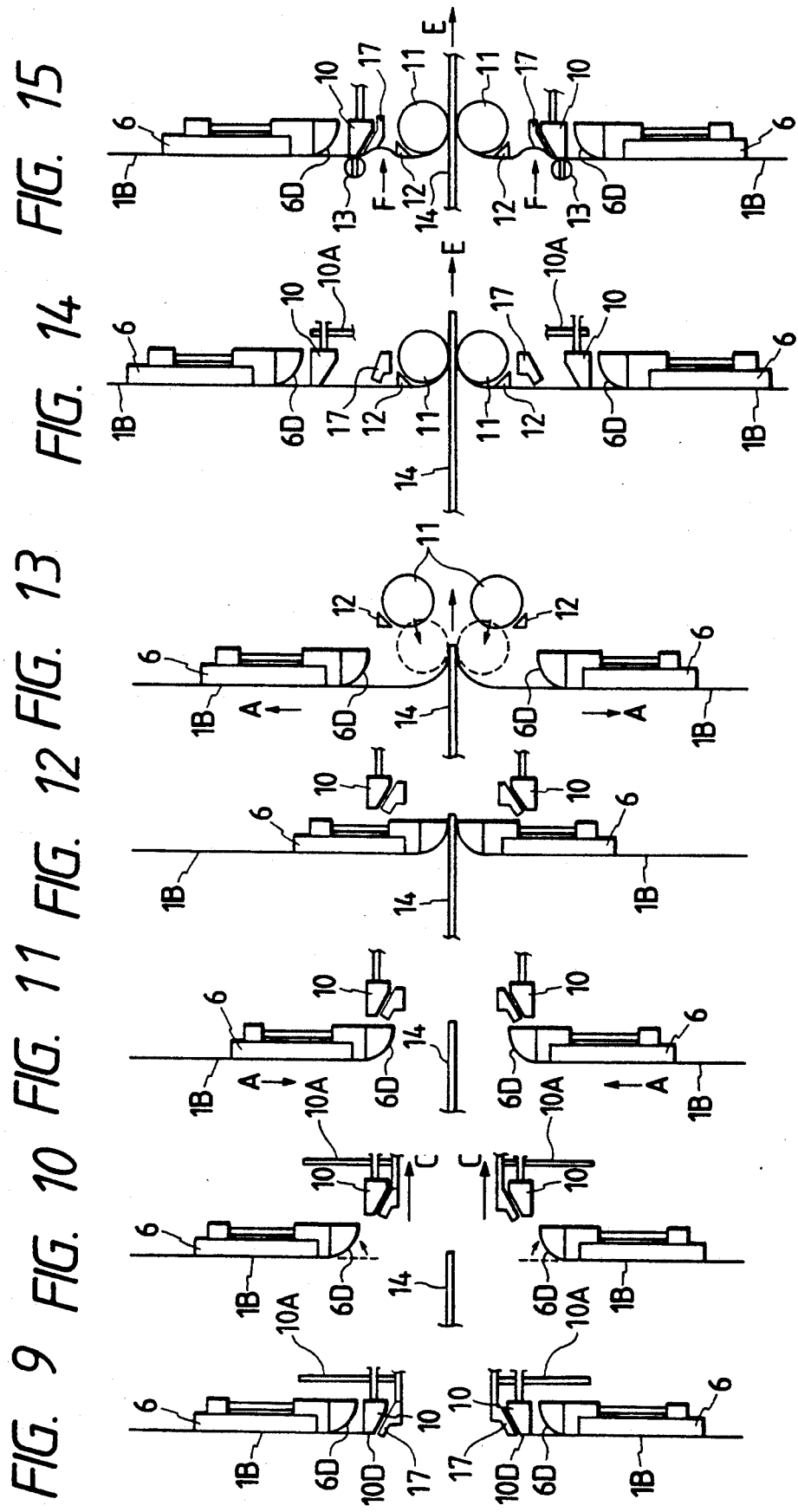

ADJUSTABLE FILM CUTOFF UNIT

BACKGROUND OF THE INVENTION

1. Field Of The Invention

The present invention relates to a thin film laminating apparatus, particularly to a thin film laminating apparatus by which a laminated film, which is a thin film and consists of a photosensitive resin layer and a light-transmissible resin film, is bonded, under heat and pressure, to a base plate for a printed circuit board.

2. Description Of The Background Art

An apparatus for continuously laminating a film to each of a plurality of base plates for printed circuit boards, as the base plates are brought to the apparatus by a roller conveyor or the like and the film is cutoff to a length corresponding to that of each base plate, is well known. For the cutoff, a conventional moving cutoff unit having a rotary disk cutter, which is reciprocated across the film, is generally used.

However, the rotary disk cutter of the conventional moving cutoff unit needs to be reciprocated extremely quickly if the cutter is to properly cutoff the moving film perpendicularly to the longitudinal direction thereof. Since the width of the film is usually about 600 mm, the rotary disk cutter needs to be moved by about 700 mm. Since there is a limit to the speed of the movement of the cutoff unit, the speed of the movement of the film is also limited. In addition, quickly starting the movement of the rotary disk cutter and quickly stopping the same movement will result in a strong impact on the guide for the cutter. This force will result in increasing the cost of maintenance of the cutoff unit.

The present invention was made in order to solve these problems. Accordingly, it is an object of the present invention to provide a thin film laminating apparatus in which a thin film of large width is quickly cutoff by a rotary cutoff unit and then bonded to a base plate.

It is another object of the present invention to provide a rotary cutoff unit which rapidly cuts off a film but does not generate a large impact force on the cutoff unit.

It is yet another object of the present invention to provide a thin film laminating apparatus of simple construction.

The above-mentioned and other objects of the present invention and the novel features thereof will be apparent from the description herein and the drawings attached hereto.

SUMMARY OF THE INVENTION

In the thin film laminating apparatus provided in accordance with the present invention, a thin film whose length corresponds to that of the base plate is bonded to the thin film surface of the plate by a pressure laminating roller. The apparatus has a body and a base plate conveyance mechanism for conveying the base plate to a thin film laminating position defined by the body and for conveying the base plate out from that position. A thin film feed member, which sucks the continuous thin film at the leading edge thereof onto the feed member and feeds the leading edge to the thin film laminating position, is provided on a support member. The support member is provided on the body of the apparatus so that the support member can be moved toward and away from the laminating position. A holding member is provided on the support member so that the holding member can be moved forward to the rear side of the thin film and backward therefrom. The holding member has a holding surface, with which the fed to the thin film laminating position by the feed member comes into surface contact at the leading edge of the film. The holding surface has suction holes connected to an air pressure reduction system for sucking the thin film at the leading edge thereof on the holding surface. The fixed cutter of the rotary cutoff unit is provided on the body of the apparatus so that the fixed cutter can be moved forward to the rear side of the thin film and backward therefrom. The holding member is coupled to the feed member so that the holding member can be moved together with the feed member toward and away from the thin film laminating position. The holding member is coupled to the fixed cutter so that the holding member can be moved together with the fixed cutter forward to the rear side of the thin film and backward therefrom. The rotary cutter of the rotary cutoff unit is provided on the body of the apparatus so that the rotary cutter can be moved forward to the rear side of the thin film and backward therefrom. Finally, the pressure bonding roller is operative so that the thin film held in the laminating position by the feed member is bonded by the roller to the laminating surface of the base plate, beginning with the leading edges of the film and the surface and extending to the trailing edges of the film and the surface.

Another feature of the apparatus is that the rotary cutter is rotatably supported at both the ends thereof by a slider which can be moved backward to the thin film and forward therefrom on a support plate coupled to a base. The slider can be fixed in a predefined position with respect to the support plate or can be moved forward away from the thin film.

With the present invention, thin films of large width can be quickly and securely cutoff and bonded to the base plate, through a simple construction. Also, since the rotary cutoff unit comprises rotary and fixed cutters extending across the thin film, the continuous thin film is cut simply by instantaneously turning the rotary cutter.

Furthermore, since the slider supporting the rotary cutter can be moved forward, the continuous thin film can be easily manually inserted between the rotary and the fixed cutters before the start of the automatic and continuous operation of the apparatus so as to enhance the efficiency of handling work on the film.

Finally, the structure of the rotary cutter, being rotatably supported at both the ends thereof by the slider movable backward and forward relative to the thin film, on the support plate coupled to the base, can be not only fixed in a prescribed position with respect to the support plate but also can be moved forward away from the film. Also, the fixed cutter is coupled to the holding member, and is therefore movable forward to the rear side of the thin film and backward therefrom. As a result, the thin film can be quickly cutoff, and the rotary cutoff unit is prevented from imparting a large impact to the unit.

BRIEF DESCRIPTION OF THE DRAWINGS

FIGS. 9, 10, 11, 12, 13, 14 and 15 are views for explaining the operation of the apparatus.

DESCRIPTION OF THE PREFERRED EMBODIMENT

An embodiment of the present invention is hereafter described in detail with reference to the drawings.

Figure 1:
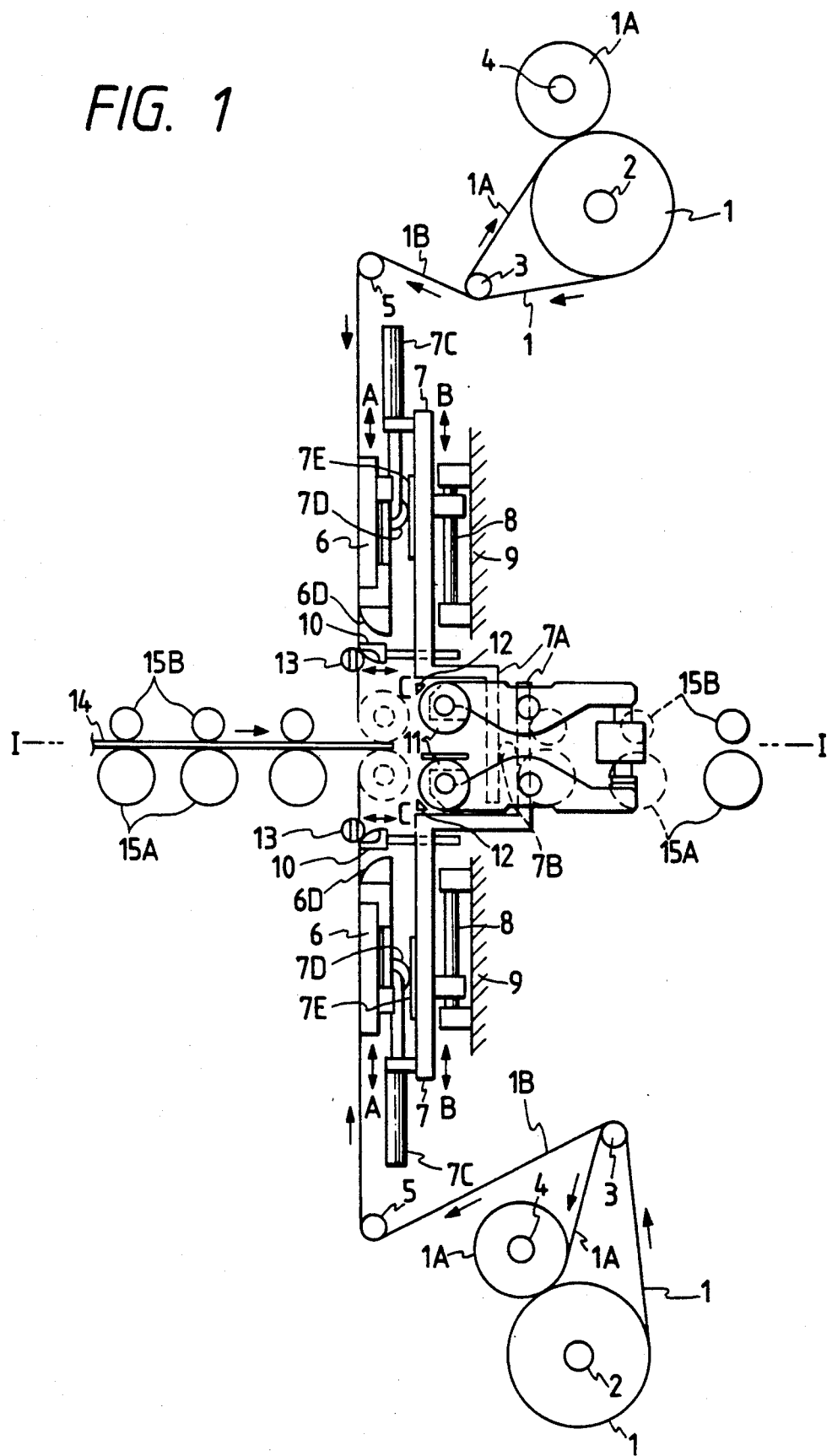
FIG. 1 is a schematic view of a thin film laminating apparatus which is an embodiment of the present invention.

FIG. 1 is a schematic view of a thin film laminating apparatus by which laminated films, each of which consists of a photosensitive resin layer and a light-transmissible resin film, are bonded, under heat and pressure, to the obverse and reverse sides of a base plate for a printed circuit board. In the film laminating apparatus, a laminated film 1 consisting of another light-transmissible resin film 1A, which is a protective film, the photosensitive resin layer and the former light-transmissible resin film, is continuously wound on a supply roller 2 in advance as shown in FIG. 1. The film 1 from the supply roller 2 is divided, by a separation roller 3, into a light-transmissible resin film 1A and a film 1B consisting of the other light-transmissible resin film and the photosensitive resin layer exposed on one side thereof, which is to be bonded to the base plate. The divided light-transmissible resin film 1A is wound on a winding roller 4. A pair of such supply rollers 2 and a pair of such winding rollers 4 are provided over and under a base plate conveyance passage I—I, as shown in FIG. 1. The leading edge of the divided film 1B is fed to a main vacuum suction plate 6, which is a film feed member, along a tension roller 5, as shown in FIG. 1.

The main vacuum suction plate 6 is moved toward and away from a film position in directions A shown in FIG. 1. The plate 6 is provided on a support member 7 slidably fitted on a guide member 8 provided on the body 9 of the apparatus, and is coupled to a rack 7A integrally provided on the support member. A pair of such support members 7 are provided over and under the base plate conveyance passage I—I so that the support members can be moved toward and away from each other by a driver such as a pneumatic cylinder through a rack and pinion mechanism including the racks 7A and a pinion 7B engaged therewith. When the support members 7 are moved toward and away from each other, they slide on the guide members 8 in directions B. The main vacuum suction plate 6 is moved toward and away from the base plate conveyance passage I—I by a driver 7C provided on the support member 7, through a rack and pinion mechanism coupled to the driver and including a pinion 7D coupled to the shaft of the driver, a rack 7E provided on the support member, and another rack 7E provided on the reverse side of the main vacuum suction plate, which is not the film suction side thereof. The main vacuum suction plate 6 can be moved in the directions A independently of the support member 7. The tip portion 6D of the main vacuum suction plate 6, which is located nearer the film laminating position than the other portion of the plate, has a film suction surface shaped as an arc when viewed transverse to the conveyance passage I—I. The film suction surface has a plurality of film suction holes for sucking the film 1B at the leading edge thereof against the resiliency of the film so as to hold the film on the surface. The leading edge of the film 1B sucked on the tip portion 6D of the plate 6 is fed to the film laminating position by moving the plate toward the base plate conveyance passage I—I in the direction A.

A holding member 10 for cutting off the film 1B is provided near a film feed passage, between the main vacuum suction plate 6 and the film laminating position. A pair of such holding members 10 are provided over and under the base plate conveyance passage I—I. The holding member 10 holds the film 1B in a cutoff position, and makes it possible for the trailing edge of the film, which is generated as a result of the cutoff of the film, to be sucked onto the tip portion 6D of the main vacuum suction plate 6. For that purpose, the holding member 10 can be moved in directions C toward and away from the film feed passage. The holding member 10 is coupled to the support member 7 by a slidable member. The holding member 10 holds the film 1B at the trailing edge thereof at the time of the cutoff of the film in the cutoff position so that the film is formed with a loosened part at the trailing edge of the film between the holding member and a vacuum suction bar 12. Bar 12 may be replaced by a pinching bar or a film trailing edge holder. To form the film 1B with the loosened part, the speed of the feed of the film by the main vacuum suction plate 6 and the holding member 10 is made higher than the circumferential velocity of a heat and pressure bonding roller 11, which is equal to the speed of the heat and pressure bonding of the film to the base plate by the roller. The loosened part of film 1B is created when the trailing portion of the film is cutoff in the cutoff position while the leading portion is being bonded to the base plate under heat and pressure. A cutoff unit 13 operates to cut the film and is located opposite the holding member 10 across the film feed passage.

The heat and pressure bonding roller 11 can be moved between a put-aside position shown by a full line in FIG. 1, and a film laminating position shown by a dotted line in the Figure.

The vacuum suction bar 12 sucks the film 1B at the trailing edge thereof on the bar to apply appropriate tension to the film to prevent it from undergoing a wrinkle or the like when the film is bonded to the base plate under heat and pressure. The vacuum suction bar 12 is revolved around the heat and pressure bonding roller 11. Since the constitution and operation of the bar 12 are described in detail in the Japanese Patent Application (OPI) No. 205140/86 (the term "OPI" as used herein means an "unexamined published application"), they are not described in detail herein. A pair of such heat and pressure bonding rollers 11 and a pair of such vacuum suction bars 12 are provided over and under the base plate conveyance passage I—I.

The base plate 14 is conveyed in the base plate conveyance passage I—I by a base plate conveyance mechanism built in or attached to the film laminating apparatus so that the base plate is moved to the film laminating position for the heat and pressure bonding of the film 1B to the base plate, and thereafter moved to an exposure apparatus located next to the film laminating apparatus. The base plate conveyance mechanism primarily includes drive rollers 15A and idle rollers 15B.

Figure 2:
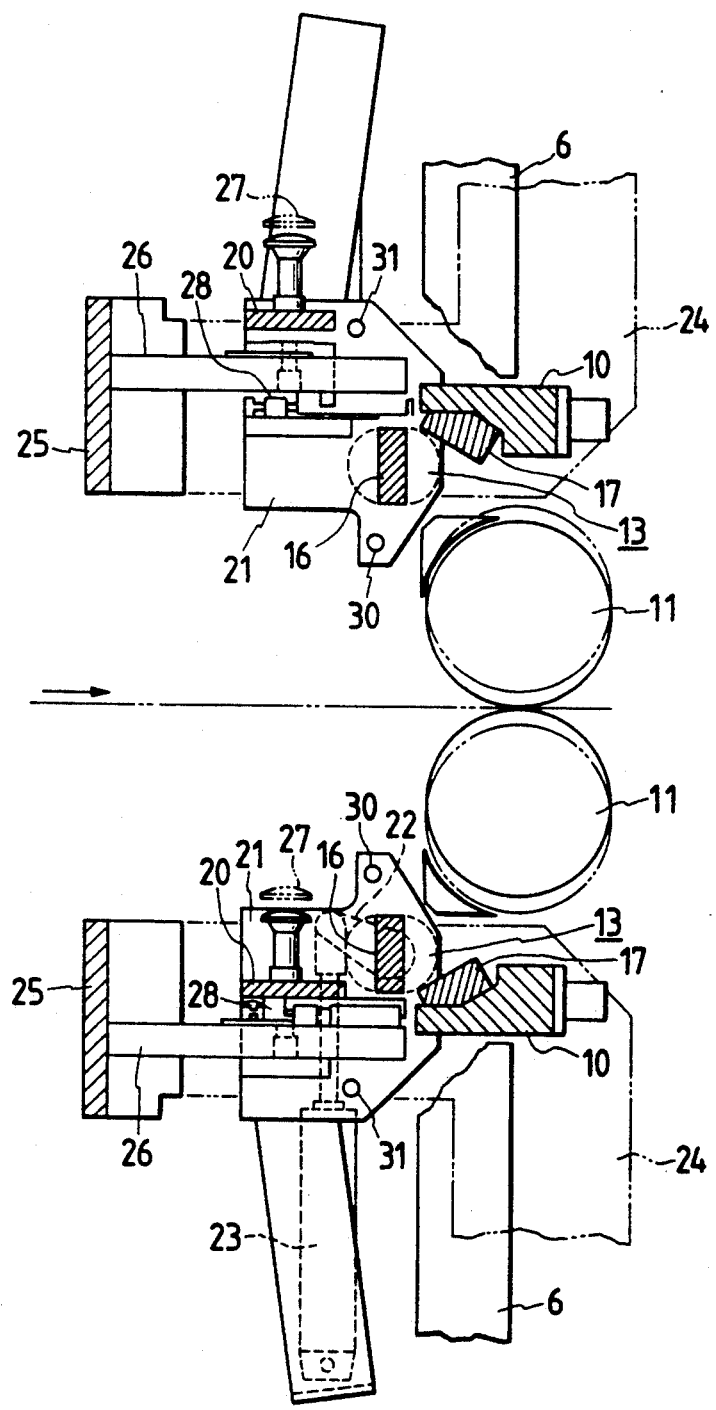
FIGS. 2, 3, 4, 5, 6, 7 and 8 are views for describing the rotary cutoff unit of the apparatus in detail.
Figure 7:
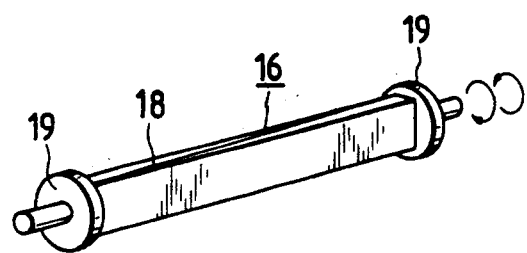

The cutoff unit 13 for cutting off the continuously-fed film 1B to a prescribed length is a rotary cutoff unit including a rotary cutter 16 and a fixed cutter 17, each of which extends by a prescribed length across the film feed passage. As shown in FIGS. 2 and 7, the rotary cutter 16, including a slender plate and disks 19 at both the ends of the plate, has a cutting edge 18 on the top of the slender plate along a diagonal thereof. The rotary cutter 16 is turned back and forth about the axes of the disks 19 so that the film 1B is cutoff as it is pinched between the rotary cutter and the fixed cutter 17 supported in contact with the peripheral surfaces of the disks 19.

Figure 3:
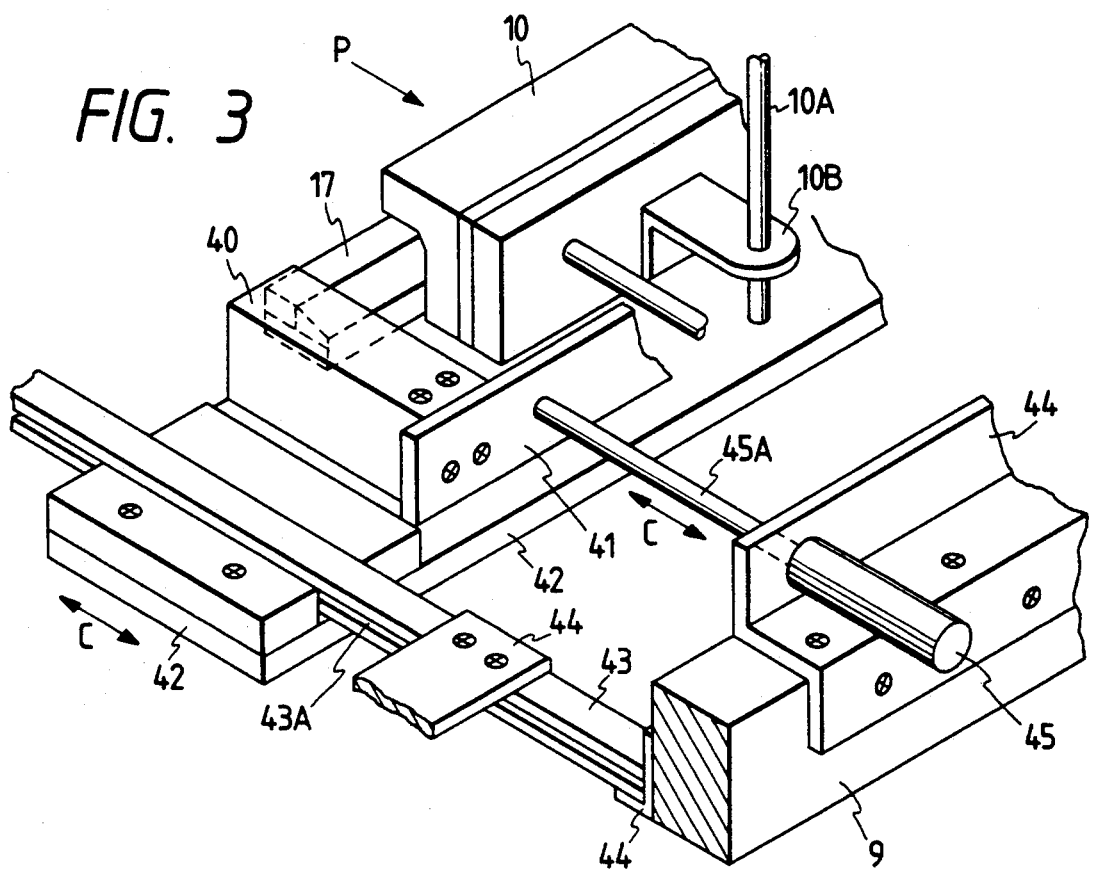

Referring to FIG. 3, the holding member 10 is coupled to the main vacuum suction plate 6 so that they can be moved together toward and away from the thin film laminating position. In other words, the holding member 10 can be slid up and down along coupling rods 10A extending through the holes of coupling members 10B and provided on a support plate 42 for the fixed cutter 17. The holding member is coupled to the fixed cutter 17 of the rotary cutoff unit 13 so that the holding member can be moved toward the film 1B from behind it. The holding member 10 has suction holes for sucking the film 1B to hold it on the member when the film is cutoff by the rotary cutoff unit 13. At the time of the cutoff of the film 1B, the holding member 10 holds the film at the trailing edge thereof and is moved forward from behind the film.

The fixed cutter 17 can be moved toward and away from the film feed passage as shown by arrows C in FIGS. 1 and 3.

Figure 4:
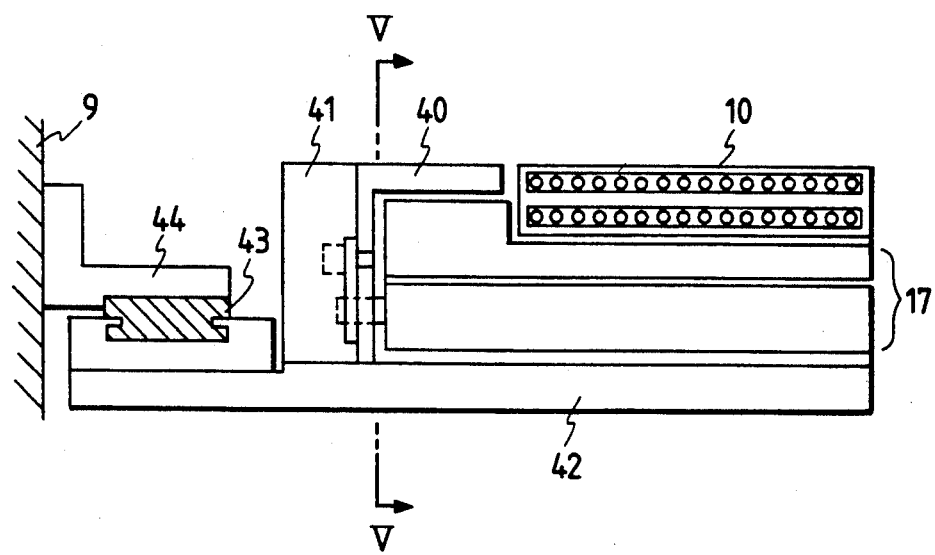
Figure 5:
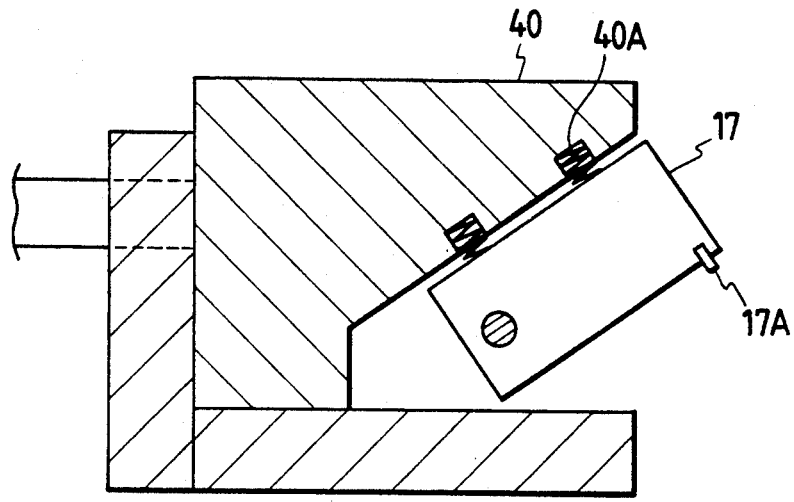
Figure 6:
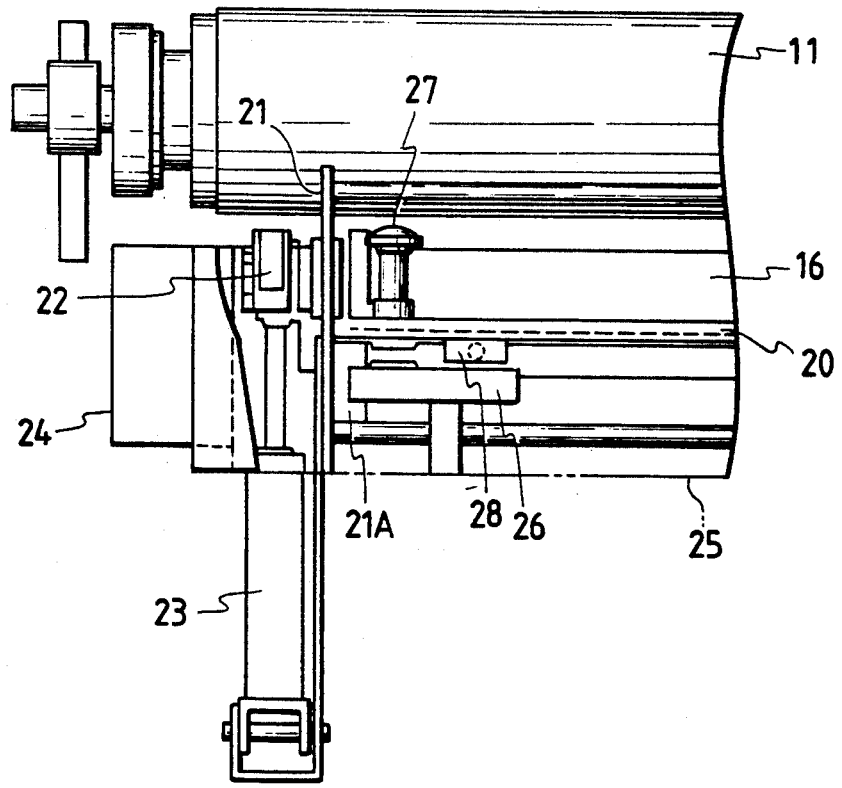
Figure 8:
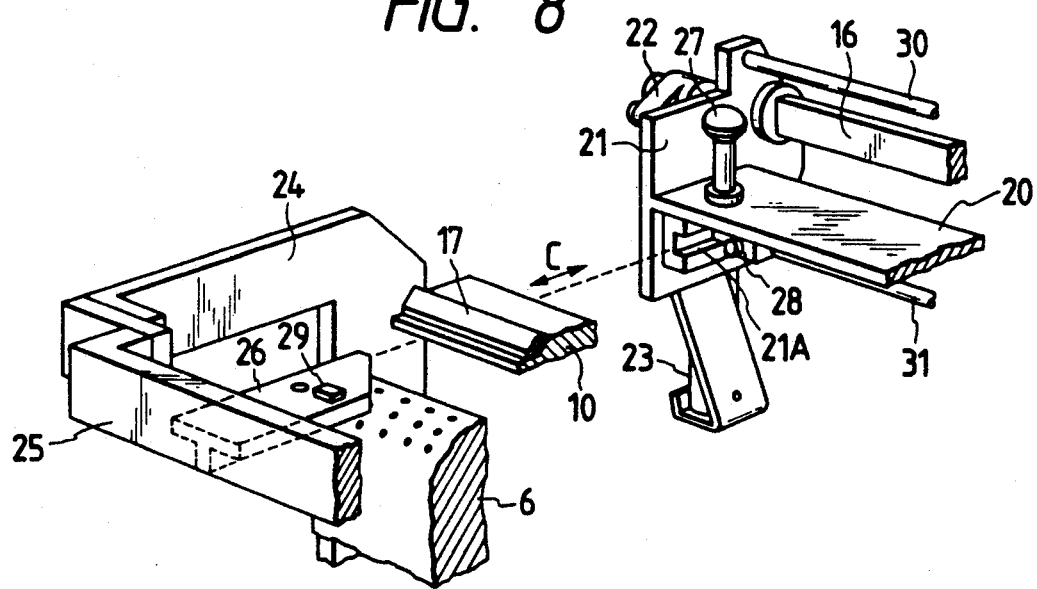

The rotary cutoff unit 13 may be described in detail with reference to FIGS. 2, 3, 4, 5, 6 and 8. FIG. 4 is a front view of the cutoff unit 13 seen along an arrow P shown in FIG. 3. FIG. 5 is a sectional view of the cutoff unit 13 along a line 5—5 shown in FIG. 4. FIG. 8 is an exploded view of the cutoff unit 13.

The fixed cutter 17 is supported by a fixed cutter support member 40 so that the fixed cutter can be slightly swung, as shown in FIG. 4. The fixed cutter 17 is pushed by springs 40A provided in the fixed cutter support member 40, as shown in FIG. 5. The support member 40 is secured to a support member 41 and the support plate 42 by screws. The support plate 42 is slidably supported by support rails 43 having guide grooves 43A and secured to the body 9 of the thin film laminating apparatus by metal members 44. The support member 41 is secured to the piston rods 45A of pneumatic cylinders 45 supported by the body 9 of the apparatus, so that the fixed cutter 17 and the holding member 10 can be moved backward and forward along the support rails 43. The coupling rods 10A extending through the holes of the coupling members 10B provided on the holding member 10 are set up on the support plate 42.

The rotary cutter 16 is supported with shafts by both the side plates 21 of a slider 20 supported so that the slider can be moved backward and forward relative to the body 9 of the thin film sticking apparatus. The rotary cutter 16 extends from one of the side plates 21 to the other. Cranks 22 provided at the ends of the shafts are reciprocated by pneumatic cylinders 23 are secured to the side plates 21, so that the rotary cutter is turned back and forth by a prescribed angle. The slider 20 is supported through the engagement of the stepped portions 21A of the side plates 21 with support plates 26 projecting from the rear of a horizontal bar 25 secured with L-shaped members 24 to the body 9 of the apparatus, so that the slider 20 is usually fixed to the support plates 26, but can be slid if engagement knobs 27 fitted in the slider are manipulated against the forces of springs provided in the knobs. Stoppers 28 having adjustment screws are attached to the bottom of the slider 20 so that when the slider is moved toward the fixed cutter 17 by pushing, the tips of the adjustment screws come into contact with projections 29 on the tops of the support plates 26 to always place the rotary cutter 16 in a prescribed position to the fixed cutter.

Air blowoff pipes 30 and 31 are supported at both the ends thereof by the side plates 21, and have air blowoff holes in the circumferential portions of the pipes to blowoff air to push the film 1B toward the heat and pressure laminating roller 11 and tip portion 6D of the main vacuum suction plate 6 when it is necessary to do so.

The cutoff of the film 1B in the thin film laminating apparatus is briefly described from now on. The leading edge of the film 1B, divided from the light-transmissible resin film 1B by the film separation roller 3, is first manually put in between the fronts of the main vacuum suction plate 6, the holding member 10 and the fixed cutter 17 and the rear of the rotary cutter 16 on the slider 20. It then is sucked onto the main vacuum suction plate and the holding member. The slider 20 is then moved toward the film 1B by pushing, so that the rotary cutter 16 is put back into the prescribed position for cutting off the film. A cutoff unit operation switch not shown in the drawings is thereafter turned on to put the cutoff unit 13 into action to cutoff the unnecessary leading portion of the film 1B. At that time, the rotary cutter 16 of the cutoff unit 13 is turned so that the unnecessary leading portion of the film 1B is instantaneously sheared off by movement of the rotary cutter against the fixed cutter 17. Since the cutting edge 18 of the rotary cutter 16 extends slightly obliquely across the axis of the cutter, the resistance to the cutoff of the film 1B is low enough to quickly and securely perform the cutoff. Although the cutting edge 18 of the rotary cutter 16 extends slightly obliquely across the axis thereof, the film 1B is not obliquely cutoff because the cutting edge 17A of the fixed cutter 17 extends horizontally as shown in FIG. 4, or extends perpendicularly across the direction of the feed of the film and the film is loosened at the time of the cutoff thereof. To cutoff the unnecessary leading portion of the film 1B and place the leading edge of the cut-off film in a prescribed position before the start of the automatic and continuous operation of the thin film laminating apparatus, the slider 20 can be easily moved forward by manipulating the engagement knobs 27. After the forward movement, the slider 20 can be simply moved backward to the original position thereof by pushing.

The automatic and continuous laminating of the film 1B to the base plate 14 under heat and pressure by the thin film laminating apparatus is briefly described with reference to FIGS. 9, 10, 11, 12, 13, 14 and 15. At the start of the automatic and continuous laminating process, the film 1B, whose unnecessary leading portion already has been cutoff through the manual operation of the apparatus as described above, is sucked at the leading edge of the film on the thin film suction surface 10D of the holding member 10 as shown in FIG. 9, and the leading edge is placed in front of the fixed cutter 17 of the rotary cutoff unit 13. When it is then detected that the base plate 14 has been brought into the base plate conveyance passage I—I by the drive rollers 15A and idle rollers 15B of the base plate conveyance mechanism and has approached the thin film laminating position, the holding member 10 and the fixed cutter 17 are moved in the direction C by the pneumatic cylinders 45 shown in FIG. 3. As a result, the leading edge of the film 1B is moved from the film feed passage to a position so that the film is sucked at the leading edge thereof onto the tip portion 6D of the main vacuum suction plate 6. The film 6B cutoff by the rotary cutoff unit 13 is thus sucked at the leading edge of the film on the tip portion 6D of the main vacuum suction plate 6 in the automatic and continuous operation of the apparatus. The leading edge of the base plate 14 brought in the conveyance passage I—I by the drive rollers 15A and idle rollers 15B of the base plate conveyance mechanism is stopped in the thin film laminating position. For the stoppage, the leading edge of the base plate 14 is detected by a sensor, which generates a signal, so that the rotation of the drive rollers 15A is ceased on the basis of the detection signal. The tip portion 6D of the main vacuum suction plate 6 is then moved toward the leading edge of the film laminating surface of the base plate 14 in the direction A so that the leading edge of the film 1B is fed to the thin film laminating position, as shown in FIG. 11. The tip portion 6D and other portion of the main vacuum suction plate 6, which are sucking the film 1B, are moved to the thin film laminating position so that the tip portion is pushed to the leading edge of the film laminating surface of the base plate 14, as shown in FIG. 12, thus laminating the leading edge of the film to that of the film laminating surface of the base plate.

After that, the suction of the film 1B on the main vacuum suction plate 6 is ceased, and the plate is moved from the thin film laminating position, as shown in FIG. 13. When the plate 6 is moved from the thin film laminating position to a position shown in FIG. 13, the support member 7 coupled to the plate is moved away from the base plate conveyance passage so that the plate and the holding member 10 are moved further away from the base plate 14. When the movement of the main vacuum suction plate 6 away from the base plate 14 is completed, the main vacuum suction plate is located in a position farthest from the base plate as shown in FIG. 14 and the fixed cutter 17 and the holding member 10 are moved toward the film 1B. The movement of the heat and pressure laminating roller 11 from the put-aside position to the thin film laminating position is started on the basis of the movement of the fixed cutter 17 and the holding member 10 toward the film 1B.

When the heat and pressure laminating roller 11 is moved to the thin film laminating position, it comes into contact with the leading edge of the film 1B under appropriate pressure. Because of the rotary power of the roller 11 and the resumption of the rotation of the drive rollers 15A of the base plate conveyance mechanism, the base plate 14 is conveyed in a direction E so that the film 1B begins to be bonded to the base plate under heat and pressure. The heat and pressure laminating roller 11 rotates so that the film 1B is bonded by a prescribed length to the thin film laminating surface of the base plate 14 from the leading edge thereof to the trailing edge thereof while being automatically fed thereto, as shown in FIG. 14. While the base plate 14 is moved in the direction of the conveyance thereof by the heat and pressure bonding roller 11 along with the laminating of the film 1B to the base plate by the roller, the film is pulled out from the supply roller 2 due to the moving action of the roller on the base plate.

When it is detected by a sensor, which is provided on the base plate conveyance passage I—I, that the trailing edge of the film 1B has reached a prescribed position on the base plate conveyance mechanism, the main vacuum suction plate 6 and the holding member 10 suck the film 1B thereon on the basis of a detection signal generated as a result of the detection. At that time, the length of the film 1B between the film pushing point of the heat and pressure bonding roller 11 and the cutting edge of the fixed cutter 17 located in the same position as the holding member 10 is substantially equal to that of the portion of the film laminating surface of the base plate 14, to which the film is yet to be bonded. The support member 7 coupled to the main vacuum suction plate 6 and the holding member 10 is moved by a prescribed length toward the base plate 14 synchronously with the suction of the film 1B onto the main vacuum suction plate and the holding member. Because of the suction of the film 1B on the holding member 10 and the movement of the support member 7, the film between the holding member 10 and the heat and pressure bonding roller 11 is loosened. To provide a convex shape to the loosened part of the film 1B in the parallel with the direction of the conveyance of the base plate 14, air is blown onto the film by pipes 30, 31 in a direction F shown in FIG. 15.

The film 1B is then cutoff by the rotary cutoff unit 13 as the film remains loosened as shown in FIG. 15, so that the trailing edge of the cut-off film corresponds to that of the base plate 14. After the cutoff, the main vacuum suction plate 6 and the holding member 10 remain at a standstill, sucking the film 1B thereon.

The trailing edge of the cut-off film 1B is bonded to that of the base plate 14 by the heat and pressure laminating roller 11. The film 1B is thus bonded, under pressure and heat, to the film laminating surface of the base plate 14, gradually from their leading edges to their trailing edges, through the rotation of the heat and pressure laminating roller 11 and the conveyance of the base plate. Since the cut-off film 1B rubs the surface of the vacuum suction bar 12 at the trailing edge of the film due to the sucking action of the bar, appropriate tension is applied to the portion of the film, which is yet to be stuck to the base plate 14, so that the film is prevented from undergoing a wrinkle or the like when being bonded to the base plate. When the trailing edge of the film 1B is thus bonded to that of the film laminating surface of the base plate 14, the heat and pressure laminating of the film thereto is completed.

When the length of the trailing edge portion of the film 1B, which is yet to be bonded to the base plate 14, has become very small immediately before the completion of the heat and pressure laminating of the film, the vacuum suction bar 12 is revolved around the heat and pressure laminating roller 11 to approach the base plate to continue the suction of the film on the bar until immediately before the completion of the heat and pressure bonding of the film, to prevent the film from undergoing a wrinkle or the like. After the completion of the laminating of the film 1B to the base plate 14, the base plate is conveyed out to the exposure apparatus by the base plate conveyance mechanism. The vacuum suction bar 12 is thereafter revolved back around the heat and pressure bonding roller 11 so that the bar is moved away from the base plate conveyance passage I—I to the original position of the bar. The heat and pressure bonding rollers 11 provided over and under the base plate conveyance passage I—I are moved away from the passage along the direction of the conveyance of the base plate 14 so that the rollers are put aside from the thin film laminating position.

As described above, the continuous film 1B is sucked at the leading edge thereof on the main vacuum suction plate 6 which serves as a thin film feed member. The plate 6 is moved toward the leading edge of the thin film laminating surface of the base plate 14 conveyed to the thin film laminating position, so that the leading edge of the continuous film 1B is fed thereto and bonded to the base plate in the thin film laminating position. The suction of the film 1B on the main vacuum suction plate 6 then is ceased. The plate 6 is moved from the base plate 14. The heat and pressure laminating roller 11 is put into pressure contact with the leading edge of the film 1B bonded to the leading edge of the film laminating surface of the base plate 14, and is then rotated so that the film is bonded to the film laminating surface of the base plate from the leading edge thereof to the trailing edge thereof while the film is automatically fed thereto. When the trailing edge of the base plate 14 is detected by the sensor provided in a prescribed position on the base plate conveyance mechanism, the film 1B being fed is sucked onto the main vacuum suction plate 6 and the holding member 10. The support member 17 is then quickly moved so that the main vacuum suction plate 6 and the holding member 10 which are coupled to the support member are moved toward the base plate conveyance passage I—I. As a result, the film 1B between the holding member 10 and the vacuum suction bar 12 is loosened. The continuous film 1B is cutoff by the rotary cutoff unit 13 depending on the length of the base plate 14, so that the film has the trailing edge thereof. The trailing edge of the cut-off film 1B is stuck to that of the film laminating surface of the base plate 14 by heat and pressure laminating roller 11. The film 1B of large width can thus be quickly and securely cutoff and bonded to the base plate 14 through a simple construction.

The rotary cutoff unit 13 is provided so that the rotary cutter 16 and fixed cutter 17 thereof extend across the film 1B. The film 1B is cutoff, only by instantaneously turning the rotary cutter 16, as the film is pinched between the rotary cutter and the fixed cutter 17. For that reason, the film 1B of large width can be quickly and securely cutoff.

Since the side plates 21 supporting the rotary cutter 16 can be moved forward, the continuous film 1B can be easily inserted manually between the rotary cutter and the fixed cutter 17 before the start of the automatic and continuous operation of the thin film laminating apparatus so as to enhance the efficiency of handling work on the film.

The rotary cutter 16 is rotatably supported at both the ends thereof by the slider 20 movable backward and forward, relative to the film 1B, on the support plate 26 coupled to the horizontal bar 25. The slider 20 can be not only fixed in a prescribed position to the support plate 26 but also moved forward away from the film 1B. The fixed cutter 17 can be moved in conjunction with the holding member 10 which can be moved forward to the film 1B and backward therefrom. As a result, the film 1B can be quickly cutoff by the rotary cutoff unit 13, and the unit is prevented from imparting an impact to the unit.

Figure 16:
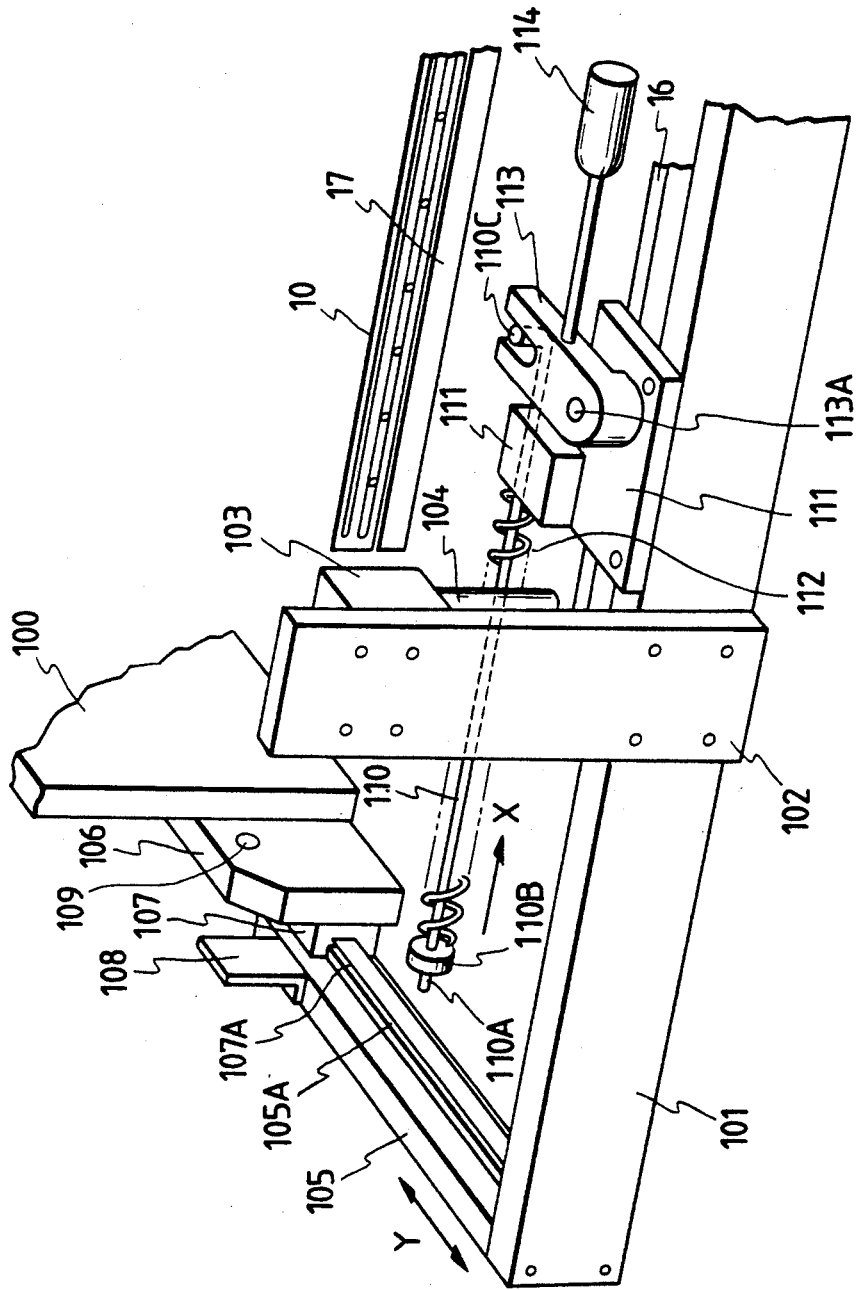
FIG. 16 is a perspective view of a major part of a mechanism which is a modification of a mechanism for positioning the rotary cutter of the rotary cutoff unit.

FIG. 16 is a perspective view of a mechanism which is a modification of a mechanism for positioning the rotary cutter 16 of the rotary cutoff unit 13 shown in FIG. 1. As for the mechanism shown in FIG. 16, the rotary cutter 16 is supported by a mounting frame 102 attached to a U-shaped horizontal frame 101, and can be turned by the pistons of pneumatic cylinders 104 secured with cylinder holding members 103 to the mounting frame. Guide rails 105 having guide grooves 105A are provided at both the ends of the U-shaped horizontal frame 101. Guide rail support members 107 are provided on a mounting frame 106 secured to the base frame 100 of the thin film laminating apparatus, and have guide projections 107A fitted in the guide grooves 105A of the guide rails 105. As a result, the U-shaped horizontal frame 101 is supported by the guide rail support members 107 so that the frame can be slid in directions Y. The guide rail 105 is fitted with a magnetic sensor 108 for confirming whether or not the U-shaped horizontal frame 101 is accurately set in a film cutoff position for the rotary cutter 16 of the rotary cutoff unit 13 to cutoff the film 1B. The confirmation is performed through the detection of a metal plate provided in a prescribed position on the body of the apparatus so as to face the magnetic sensor 108. The result of the detection is indicated. The mounting frame 106 has locking holes 109 for locking the U-shaped horizontal frame 101 for accurately placing the rotary cutter 16 in a film cutoff position. Locking shafts 110, whose tip portions 110A are fitted in the locking holes 109, are coupled to the U-shaped horizontal frame 101 by locking shaft attaching members 111. The portion of each locking shaft 110, which adjoins the tip portions 110A thereof, has an engagement part 110B with which a compressed spring 112 is engaged. The locking shafts 110 are slidably supported through the locking shaft attaching members 111, and provided with projections 110C. The compressed spring 112 extends between the engagement part 100B and the locking shaft attaching member 111. A locking shaft control lever 113 is provided on the locking shaft attaching member 111, engaged with the projection 110C of the locking shaft 110, and rotatably supported by a rotary shaft 113A. A locking shaft control handle 114 is coupled to the locking shaft control lever 113.

The operation of the positioning mechanism shown in FIG. 16 is described in detail from now on. When the rotary cutter 16 of the rotary cutoff unit 13 is to be placed in the film cutoff position, the locking shaft control handle 114 is pulled forward so that the locking shaft 110 is moved in a direction X against the resilient force of the compressed spring 112. The U-shaped horizontal frame 101 is moved in a direction X against the resilient force of the compressed spring 112. The U-shaped horizontal frame 101 is pushed inward to the body of the thin film apparatus in the direction Y so that the tip portion 110A of the locking shaft 110 is fitted in the locking hole 109 of the mounting frame 106. The locking shaft control handle 114 is released from a handle so that the U-shaped horizontal frame 101 is locked to the mounting frame 106. At that time, whether the rotary cutter 16 is accurately placed in the film cutoff position or not is detected by the magnetic sensor 108 and indicated. When the rotary cutter 16 is to be put out of the film cutoff position, the locking shaft control handle 114 is pulled forward so that the locking shaft 110 is moved in the direction X against the resilient force of the compressed spring 112, and the tip portion 110A of the locking shaft 110 is moved in the direction X against the resilient force of the compressed spring 112, and the tip portion 110A of the locking shaft 110 is put out of the locking hole 109 of the mounting frame 106. The U-shaped horizontal frame 101 is then pulled outward from the body of the apparatus in the direction YT. The locking shaft control handle 114 is released from a hand. The rotary cutter 16 of the rotary cutoff unit 13 can thus be easily put into and out of the film cutoff position.

The present invention is not confined to the above-described embodiment and modification, but may be embodied or practiced in other various ways without departing from the spirit or essential character thereof.

What is claimed:

1. A thin film laminating apparatus, by which a continuous thin film is cut to a length corresponding to that of a base plate and is laminated to a thin film laminating surface of said plate, comprising:

a body defining a thin film laminating position;

a support member provided on said body of said apparatus, said support member being movable toward any and away from said laminating position;

a base plate conveyance mechanism for conveying said plate to said laminating position and for conveying said plate out from said position;

a thin film feed means, which sucks the continuous thin film at a leading edge thereof on said means and feeds said leading edge to said laminating position, said feed means being provided on said support member;

a rotary cutoff unit comprising a stationary cutter, provided on said body so that said cutter can be moved forward to one surface of said film and backward therefrom, and a rotary cutter, rotatably supported on a sliding unit which is slidingly attached to a support plate, said support plate being fixedly attached to said base, said sliding unit being capable of selectively being fixed in a predetermined position relative to said support plate and sliding relative said support plate so as to move said rotary unit cutter towards and away from said film;

a holding member provided on said support member so that said holding member can be relatively moved forward to the one surface of said film and backward therefrom, said holding member having a holding surface with which said film fed to said laminating position by said feed member comes into surface contact at said leading edge, said holding surface having thin film suction means for sucking said film at said leading edge onto said holding surface, said holding member being coupled to said film feed means so that said holding member can be moved together with said film feed means toward and away from said laminating position, said holding member also being coupled to said stationary cutter so that said holding member can be moved in concert with said cutter forward to the one side of said film and backward therefrom; and laminating means being operatively supported so that said film held in said laminating position by said feed member is laminated to said thin film laminating surface of said base plate.

2. A thin film laminating apparatus according to claim 1 wherein said holding member holds said film at a trailing edge thereof at the time of the cutoff of said film in the cutoff position so that said film is formed with a loosened part at said trailing edge of said film.

3. A thin film laminating apparatus according to claim 1 wherein said rotary cutoff unit is operable to rotate said rotary cutter by a prescribed angle by operation of pneumatic crank means.

4. A thin film laminating apparatus according to claim 1 wherein said support member comprises manually adjustable engagement means for fixing said member to said body.

5. A thin film laminating apparatus according to claim 1 wherein said support member further comprises air blowoff means for pushing said film toward said thin film feed means.

6. A thin film laminating apparatus according to claim 1 wherein said stationary cutter has a cutting edge extending perpendicularly across the direction of the feed of the film, and said rotary cutter has a cutting edge extending slightly obliquely across the axis thereof and being inclined to the cutting edge of said stationary cutter.

7. A thin film laminating apparatus having a rotary cutoff unit by which a continuous thin film is cut to a predetermined length and a laminating device for laminating the cut film to a base plate, said rotary cut-off unit comprising:

a rotary cutter and a stationary cutter, provided transverse to said film at a cutting position, said rotary cutter being rotatably supported at both ends thereof by a slider which can be moved backward and forward relative to said film on a support plate, said support plate being coupled to a base, said slider being fixable in a prescribed position with respect to said support plate and movable forward away from said film, said stationary cutter being provided in the vicinity of holding member for holding a leading end of said film, said holding member being relatively moved forward to said film and backward therefrom.

* * * * *